United States Patent [19]

Assar et al.

[11] Patent Number: 5,485,595
[45] Date of Patent: Jan. 16, 1996

[54] FLASH MEMORY MASS STORAGE ARCHITECTURE INCORPORATING WEAR LEVELING TECHNIQUE WITHOUT USING CAM CELLS

[75] Inventors: Mahmud Assar, Morgan Hill; Petro Estakhri, Pleasonton; Siamack Nemazie; Mahmood Mozaffari, both of San Jose, all of Calif.

[73] Assignee: Cirrus Logic, Inc., Fremont, Calif.

[21] Appl. No.: 131,495

[22] Filed: Oct. 4, 1993

Related U.S. Application Data

[63] Continuation-in-part of Ser. No. 37,893, Mar. 26, 1993, and Ser. No. 38,668, Mar. 26, 1993, Pat. No. 5,388,083.

[51] Int. Cl.[6] .................................. G06F 12/02; G06F 12/14
[52] U.S. Cl. ...................... 395/430; 395/431; 395/435; 395/483; 395/413; 365/185.11; 364/244.5; 364/251; 364/256.3; 364/DIG. 1
[58] Field of Search ............................ 395/425; 365/185, 365/218, 900, 189.07

[56] References Cited

U.S. PATENT DOCUMENTS 5,283,882  2/1994  Smith et al. ........................... 395/425
5,337,275  8/1994  Garner ............................... 365/189.01
5,341,330  8/1994  Wells et al. ............................. 365/185
5,353,256  10/1994  Fandrich et al. ..................... 365/230.03
5,357,475  10/1994  Hasbun et al. .......................... 365/218
5,404,485  4/1995  Ban ........................................ 395/425

Primary Examiner—Glenn Gossage
Assistant Examiner—Reginald G. Bragdon
Attorney, Agent, or Firm—Haverstock & Associates

[57] ABSTRACT

A semiconductor mass storage device can be substituted for a rotating hard disk. The device avoid an erase cycle each time information stored in the mass storage is changed. Erase cycles are avoided by programming an altered data file into an empty mass storage block rather than over itself as a hard disk would. Periodically, the mass storage will need to be cleaned up. Secondly, a circuit and method are provided for evenly using all blocks in the mass storage. These advantages are achieved through the use of several flags, a map to correlate a logical address of a block to a physical address of that block and a count register for each block. In particular, flags are provided for defective blocks, used blocks, old versions of a block, a count to determine the number of times a block has been erased and written and an erase inhibit flag. Reading is performed by providing the logical block address to the memory storage. The system sequentially compares the stored logical block addresses until it finds a match. That data file is then coupled to the system.

15 Claims, 13 Drawing Sheets

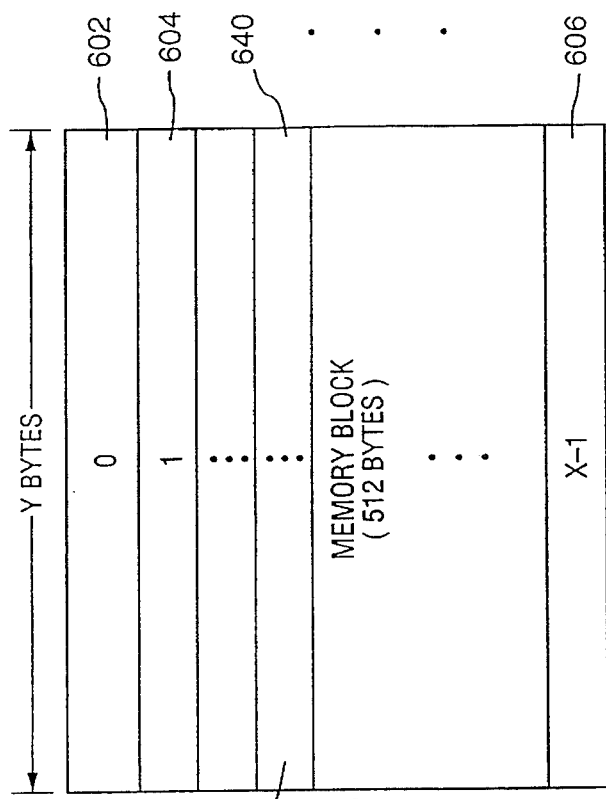
FIG. 9
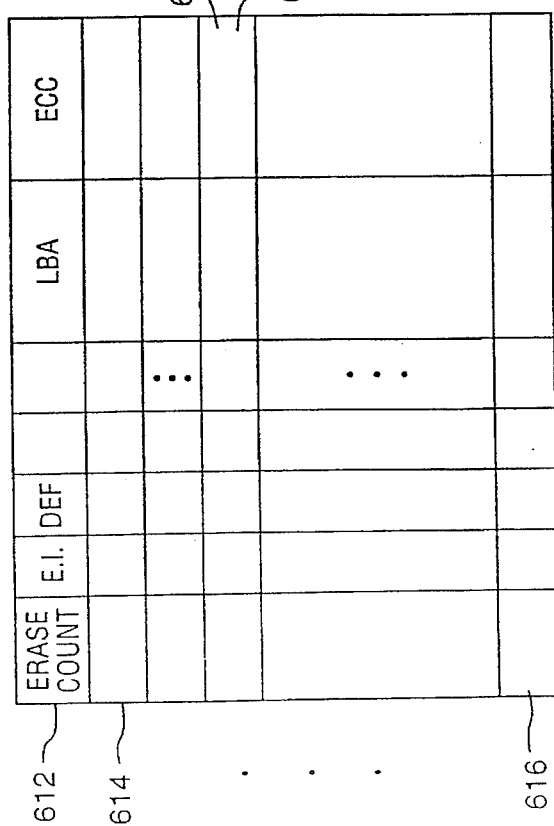
FIG. 10
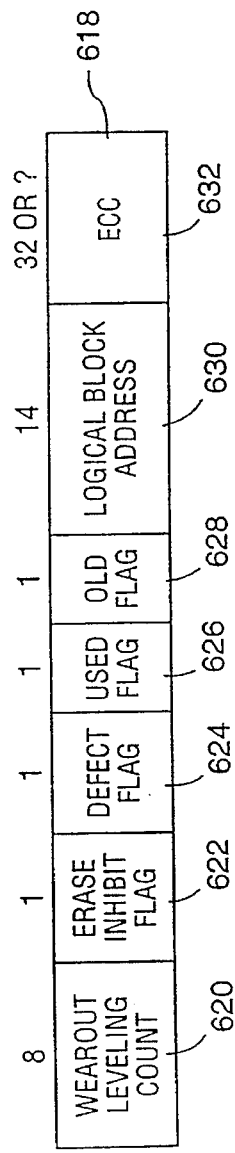

FLASH MEMORY MASS STORAGE ARCHITECTURE INCORPORATING WEAR LEVELING TECHNIQUE WITHOUT USING CAM CELLS

RELATED APPLICATIONS

This application is a continuation-in-part of application Ser. No. 08/037,893, filed on Mar. 26, 1993 and application Ser. No. 08/038,668 filed on Mar. 26, 1993 and issued on Feb. 7, 1995 as U.S. Pat. No. 5,388,083.

FIELD OF THE INVENTION

This invention relates to the field of mass storage for computers. More particularly, this invention relates to an architecture for replacing a hard disk with a semiconductor non-volatile memory and in particular flash memory.

BACKGROUND OF THE INVENTION

Computers have used rotating magnetic media for mass storage of data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be non-volatile and alterable. The inventors have determined that FLASH memory is preferred for such a replacement. It should be noted that $E^2PROM$ is also suitable as a replacement for a hard disk drive but it has lower performance.

FLASH memory is a single transistor memory cell which is programmable through hot electron injection or source injection and erasable through Fowler-Nordheim tunneling. The programming and erasing of such a memory cell requires current to pass through the dielectric surrounding a floating gate electrode. Because of this, such types of memory have a finite number of erase-write cycles. Eventually, the dielectric will fail. Manufacturers of FLASH cell devices specify the limit for the number of erase-write cycles as between 10,000 and 100,000. Some FLASH technologies have over-erase problems, therefore they need to be programmed before erasing to improve uniformity. They also have to be verified for successful erase. Accordingly, unlike rotating magnetic media, a FLASH memory mass storage device does not have an indefinite lifetime.

Another requirement for a semiconductor mass storage device to be successful is that its use in lieu of a rotating media hard disk mass storage device be transparent to the system designer and the user. In other words, the designer of a computer incorporating such a semiconductor mass storage device could simply remove the hard disk and replace it with a semiconductor mass storage. All presently available commercial software should operate on a system employing such a semiconductor hard disk without the necessity of any modification.

SunDisk proposed an architecture for a semiconductor mass storage using FLASH memory at the Silicon Valley PC Design Conference on Jul. 9, 1991. That mass storage system included read-write block sizes of 512 Bytes (or multiples thereof) just like IBM PC compatible hard disk sector sizes. (IBM PC is a trademark of IBM Corporation.)

As in conventional hard disks, it appears in the SunDisk architecture that there is an erase-before-write cycle each time data is changed in the mass storage. Thus, if a program or data block is to be changed, the data is written to RAM and appropriately changed, the FLASH block is fully programmed, then erased and then reprogrammed to the new memory condition. Unlike a hard disk device, in a FLASH memory device an erase cycle is slow which can significantly reduce the performance of a system utilizing FLASH memory as its mass storage.

Though such an architecture provides a workable semiconductor mass storage, there are several inefficiencies. First of all, each time a memory block is changed, there is a delay to the entire system due to the necessary erase-before-write cycle before reprogramming the altered information back into the block. The overhead associated with erase-before-write cycles is costly in terms of system performance.

Secondly, hard disk users typically store both information which is rarely changed and information which is frequently changed. For example, a commercial spread sheet or word processing software program stored on a user's system are rarely, if ever, changed. However, the spread sheet data files or word processing documents are frequently changed. Thus, different sectors of a hard disk typically have dramatically different usage in terms of the number of times the information stored thereon is changed. While this disparity has no impact on a hard disk because of its insensitivity to data changes, in a FLASH memory device, this variance can cause sections of the mass storage to wear out and be unusable significantly sooner than other sections of the mass storage.

The inventors previously proposed a solution to this problem using a CAM to store a table correlating the logical block address to the physical address. The inventions relating to that solution are disclosed in U.S. patent application Ser. No. 08/037,893 filed on Mar. 26, 1993 and U.S. patent application Ser. No. 08/038,668 also filed on Mar. 26, 1993 and issued on Feb. 7, 1995 as U.S. Pat. No. 5,388,083. Those applications are incorporated herein by reference.

The inventors' previous solution discloses two primary algorithms and an associated hardware architecture for a semiconductor mass storage device. It will be understood that 'data file' in this patent document refers to any computer file including commercial software, a user program, word processing software document, spread sheet file and the like. The first algorithm in the previous solution provides means for avoiding an erase-before-write cycle when writing a modified data file back onto the mass storage device. Instead, no erase is performed and the modified data file is written onto an empty portion of the mass storage. In addition, the second algorithm prevents any portion of the mass storage from being erased a substantially larger number of times than any other portion. This prevents any one block of the mass storage from failing and becoming unusable earlier than any other block thereby extending the life of the entire mass storage.

The semiconductor mass storage architecture has blocks sized to conform with commercial hard disk sector sizes.

The blocks are individually erasable. In one embodiment, the semiconductor mass storage can be substituted for a rotating hard disk with no impact to the user, so that such a substitution will be transparent. Means are provided for avoiding the erase-before-write cycle each time information stored in the mass storage is changed. (The erase cycle is understood to include, fully programming each bit in the block to be erased, and then erasing all the bits in the block.)

According to the first algorithm, erase cycles are avoided by programming an altered data file into an empty mass storage block rather than over itself after an erase cycle of that block as done on a conventional hard disk. This would ordinarily not be possible when using conventional mass storage because the central processor and commercial software available in conventional computer systems are not configured to track continually changing physical locations of data files. The previous solution includes a programmable map to maintain a correlation between the logical address and the physical address of the updated information files.

Periodically, the mass storage will fill up because there have been no erase cycles. At such times, the mass storage needs to be cleaned up with a multi-sector erase as fully described below.

According to the second algorithm, means are provided for evenly using all blocks in the mass storage. A counter tracks the number of times each block is erased. A programmable maximum value for the counter is also provided. As the number of erase cycles for a block becomes one less than the maximum, the block is erased one last time and written with another file having a then smallest number of erase cycles. It is also prevented from being erased thereafter by setting its erase inhibit flag. After all blocks approach this maximum, all the erase counters and inhibit flags are cleared and the second algorithm is then repeated. In this way, no block can be erased a substantial number of times more than any other block.

These advantages are achieved through the use of several flags and a count register for each block. In particular, flags are provided for defective blocks, used blocks, old version of a block, a count to determine the number of times a block has been erased and written and an erase inhibit flag.

The details of the previous solution are important to understanding the present invention. In the previous solution, FIG. 1 shows an architecture for a semiconductor mass storage. All of the memory storage is FLASH EEPROM. It is possible to substitute EEPROM for some or all of the data bits shown. A memory storage 100 is arranged into N blocks of data from zero through N-1. Each of the blocks of data is M Bytes long. In the preferred embodiment of the previous solution, each block is 512 Bytes long to correspond with a sector length in a commercially available hard disk drive. In addition to the memory data block 102, a flag 104 is directly related to each data block 102. The memory 100 can contain as much memory storage as a user desires. An example of a mass storage device might include 100 MByte of addressable storage.

A non-volatile content addressable memory (CAM) 106 is associated with the memory storage 100. Preferably, the CAM 106 is formed of FLASH memory. The CAM 106 can also be EEPROM. There is one entry in the CAM 106 for every one of the N blocks in the mass storage 100. Each entry includes a number of fields which will be described below. The CAM 106 is also formed of a non-volatile memory because loss of its information would make retrieval of the data files stored in the mass storage 100 impossible.

Conventional computer systems are not configured to track continually changing physical locations of data files. According to the previous solution, each time a data file is changed it is stored into a new physical location in the mass storage. Thus, implementation of the architecture requires a mapping of the logical address 308, i.e., the address where the computer system believes the data file is stored to the physical address 408, i.e., the actual location the data file can be found is stored in the mass storage.

The logical address 308 portion of the map 108 and the flags 112, 116 and 118 form part of the CAM 106. It is possible to use other storage means than a CAM to store the address map, such as a look-up table. However, a CAM is the most efficient means known to the inventors. It is not necessary that the physical address 408 portion of the map 108 form part of the CAM. Indeed, the physical address 408 portion of the map 108 can be ordinary FLASH memory, EEPROM or even ROM. If ROM is selected for the physical address 408 array of the map 108, a defect in the ROM will prevent the block corresponding to that physical address 408 from ever being addressed. Accordingly, a changeable non-volatile memory is preferred. Note that any replacement circuit for the CAM should be nonvolatile. Otherwise, loss or removal of power to the system will result in loss of the ability to find the data files in the mass storage.

Assume for example that a user is preparing a word processing document and instructs the computer to save the document. The document will be stored in the mass storage system as shown in FIG. 1. The computer system will assign it a logical address 308, for example 526 H. The mass storage system will select a physical address 408 of an unused block or blocks in the mass storage 100 for storing the document, e.g. 728 H. That map correlating the logical address 308 to the physical address 408 is stored in the CAM 106. As the data is programmed, the system of the previous solution also sets the used/free flag 112 to indicate that this block has been written without being erased. The used/free flag 112 also forms a portion of the CAM 106. One used/free flag 112 is provided for each entry of the CAM 106.

Later, assume the user retrieves the document, makes a change and again instructs the computer to store the document. To avoid an erase-before-write cycle, the system provides means for locating a block having its used/free flag 112 unset (not programmed) which indicates that the associated block is erased. The system then sets the used/free flag for the new block 114 (FIG. 2) and then stores the modified document in that new block 114. Next, the system sets the old/new flag 116 of the previous version of the document indicating that this is an old unneeded version of the document. Lastly, the system updates the correlation between the logical address 308 and the actual physical address 408. In this way, the system avoids the overhead of an erase cycle which is required in the erase-before-write of conventional systems to store a modified version of a previous document.

The writing to mass storage process outlined above is repeated until the entire mass storage memory 100 has been filled. A full mass storage is indicated by no unset used/free flags 112 in the CAM 106. At that time a multi-sector erase is necessary and those blocks in the memory 100 and their associated CAM 106 entries having an old/new flag 116 set are all erased simultaneously. Note that it is not necessary for 100% of the blocks to have a set used/free flag 112 for a multi-sector erase to occur. For example, if a data file requiring three blocks were being written and only two blocks having unset used/free flags 112 were available, a multi-sector erase can be run.

A simultaneous erase is not needed with prior art implementations because those embodiments utilize an erase-before-write cycle rather than retaining superseded versions of data files. In such circuits, a latch of volatile logic circuits is set to couple the voltage necessary to erase the FLASH cells in the block. Because of the likely large number of memory blocks in the mass storage 100, if the CAM 106 and mass storage 100 are on the same integrated circuit (chip) coupling the old/new flag 116 to the latches in parallel would typically be very expensive in terms of surface area of the chip and coupling the old/new flags 116 serially to the latches would be expensive in terms of system performance. If the CAM 106 and the mass storage 100 are on separate chips, it is doubtful that either device could have sufficient I/O capability to interconnect the old/new flags 116 to the latches in parallel and thus, the system would suffer from a serial transfer of that information for a multi-sector erase.

Because of these problems it is preferable that no updating of the latches be performed prior to an erase of all blocks having a set old/new flag 116. To avoid this step, a plurality of old/new flag systems 104 are intimately associated with each block in the memory 102 and is programmed by the same sequence of instructions as the old/new flag 116 of the CAM 106.

FIG. 4 shows a simplified block diagram of the old/new flag system 104 which includes a non-volatile bit 120 having data which mirrors the old/new flag 116. In addition there is a volatile latch 122 coupled to receive the data in the bit 120 from the latch during an erase cycle. At the time of an erase, the data in each of the bits 120 is simultaneously coupled to each appropriate one of the latches 122 under control of a load signal coupled to each latch 122 over a load line L. Upon receiving a signal to perform the erase, the latch for every block having its associated bit 120 set then couples the voltage necessary to perform an erase of that block and its associated bit 120. After the erase is complete and verified, all the latches 122 are individually reset to a predetermined state under control of a reset signal coupled to each latch 122 over a reset line R.

For certain applications, especially for low power portable computers, a simultaneous erase of all blocks having their respective old/new flags set may be undesirable due to power availability constraints. For such applications, the blocks can be segregated into groups of blocks. Each group has a unique control line to load the latches from the nonvolatile bits. In this mode, during an erase cycle, the control lines are sequentially activated and the groups of blocks sequentially erased.

FIG. 5 shows algorithm 1 according to the previous solution. When the system receives an instruction to program data into the mass storage (step 200), then the system attempts to locate a free block (step 202), i.e., a block having an unset (not programmed) used/free flag. If successful, the system sets the used/free flag for that block and programs the data into that block (step 206).

If on the other hand, the system is unable to locate a block having an unset used/free flag, the system erases the flags (used/free and old/new) and data for all blocks having a set old/new flag (step 204) and then searches for a block having an unset used/free flag (step 202). Such a block has just been formed by step 204. The system then sets the used/free flag for that block and programs the data file into that block (step 206).

If the data file is a modified version of a previously existing file, the system must prevent the superseded version from being accessed. The system determines whether the data file supersedes a previous data file (step 208). If so, the system sets the old/new flag associated with the superseded block (step 210). If on the other hand, the data file to be stored is a newly created data file, the step of setting the old/new flag (step 210) is skipped because there is no superseded block. Lastly, the map for correlating the logical address 308 to the physical address 408 is updated (step 212).

By following the procedure outlined above, the overhead associated with an erase cycle is avoided for each write to the memory 100 except for periodically. This vastly improves the performance of the overall computer system.

In the preferred embodiment of the previous solution, the programming of the FLASH memory follows the procedure commonly understood by those of ordinary skill in the art. In other words, the program impulses are appropriately applied to the bits to be programmed and then compared to the data being programmed to ensure that proper programming has occurred. In the event that a bit fails to be erased or programmed properly, a defect flag 118 in the CAM 106 is set preventing that block from being used again.

In addition to saving the overhead of the erase cycle all but periodically, utilization of the previous solution tends to more evenly distribute the erase cycles among certain portions of the blocks of the mass storage. FIG. 3 schematically shows the types of information stored in utilizing a mass storage media 150. One portion of the mass storage 150 contains commercial applications software 152 such as word processing, spreadsheet, calendaring, calculators and the like. These portions of the mass storage 150 rarely, if ever, require an erase-reprogram cycle according to the algorithm described above.

A second section of the mass storage 150 contains user data 154. The user data 154 is frequently altered requiring the information to be reprogrammed into blocks of the free space 156 under the algorithm described above. A third portion of the mass storage 150 contains free space 156 of unprogrammed blocks.

By following the algorithm above, the storage blocks in the portions 154 and 156 of the memory 150 will recycle data files and thus be erased and reprogrammed significantly more often than the commercial applications software portion 152 of the memory 150. Accordingly, the mass storage 150 will wear out more quickly in the user data 154 and the free space 156 sections of the memory requiring earlier replacement than in sections 152 of the mass storage having data files which are rarely changed. As the number of free blocks diminishes providing a smaller number of blocks through which to recycle data files, the remaining blocks become erased more frequently, thus exacerbating the problem.

A second algorithm is provided for leveling erase cycles among all the blocks within the entire mass storage device as shown in FIG. 6. A counter is provided for each block to count the number of times each block has been erased and reprogrammed. An erase inhibit flag is also provided for each block. Once the erase count has reached the maximum for any block, the erase inhibit flag is set for that block. After that time that block cannot be erased until a clean-out erase is performed. Referring to FIG. 3, if only algorithm 1 is used eventually all of the blocks in the user data 154 and the free space 156 portions of the mass storage 150 will reach the maximum count and have their respective erase inhibit flags set. Because of this, a reallocation of the rarely erased data files stored in the memory 152 is made into the memory 154 and/or 156. In this way, sections of the mass storage which have been erased numerous times are programmed with a reallocated data file which is rarely changed thereby allowing all sections of the mass storage to eventually approach parity of erase cycles. Like the multi-sector erase, a clean-out erase can be performed in the event that there is insufficient available storage for a data file presently being performed. For example, if all but two blocks have their respective erase inhibit flags set, and a three or more block data file is being programmed, a clean-out erase can be performed to provide sufficient storage for the data file.

Once the erase inhibit flag is set for all the blocks, indicating that all the blocks have achieved parity in erase cycles, the erase inhibit and erase count registers are erased and the cycle is repeated. The selection of the maximum count depends upon the system requirements. As the value for the maximum count increases, the disparity between erase count cycles of various blocks can also increase. However, because data is shifted as a result of achieving maximum erase count this process of smoothing cycles throughout the mass storage itself introduces additional erase cycles because a block of information is transferred from a physical block having few erases to a block having the maximum number of erases. Accordingly, though low maximum count values reduce the disparity between erase cycles among the blocks it also increases the number of erase cycles to which the blocks are subjected. Accordingly, individual users may select an erase count depending upon the system needs.

In the preferred embodiment of the previous solution, algorithm 2 is merged with algorithm 1 as shown in FIG. 7. An instruction is provided by the computer system to write a data file to the mass storage (step 230) which starts the combined algorithm 1 and algorithm 2 sequence. It is first determined whether the mass storage is full (step 232). If the mass storage is not full, i.e., it has a block with its used/free flag unset, the algorithm continues and stores the data file into such a block (step 234).

If on the other hand, it is determined that there are no free blocks, then it is next determined whether there are any blocks which have both the old/new flag set AND the erase inhibit flag unset (step 236). If there are no blocks which have both the old/new flag set AND the erase inhibit flag unset (step 236), the system erases the data file, used/free flag and old/new flag in each block having its old/new flag set, and erases the counter and erase inhibit flag for every block (step 238). Step 238 is also performed in the event there are insufficient blocks remaining to store a pending data file. The algorithm then returns to block (step 232) to determine whether the disk is full.

If the system can find a block having both the old/new flag set AND the erase inhibit flag unset (step 236), then the system executes an erase procedure and erases the data file, used/free flag and old/new flag in each block having its old/new flag set. The counter is incremented and the erase inhibit flag for such blocks is not disturbed.

It is then determined whether any block having its used/free flag unset has its counter at the maximum count (step 242). If not, then the system returns to the decision step 232 and investigates again whether there is any block having its used/free flag unset (step 232).

On the other hand, if there is a block having its erase count at the maximum value, a data file is copied from another block having the then least count value (step 244) into the location having COUNT=COUNT$_{Max}$. The erase inhibit flag is then set (step 244). Note that a data file will not be copied from a block having its erase count at one less than the maximum value, COUNT$_{Max}$−1. Making such a reallocation from a source block having COUNT$_{Max}$−1 to a destination block having COUNT$_{Max}$ results in having both blocks at COUNT$_{Max}$ and no net gain. Further, the block previously having its erase count at COUNT$_{Max}$−1 is erased to no advantage, thus the erase cycle for that block would be wasted.

The old/new flag from the source block is then set (step 246) so that it can be erased during the next execution of an erase step 240. In that way the source block can be used for storage until its erase count reaches maximum and its erase inhibit flag is set. The algorithm then returns to the step 242 to determine whether there are now any blocks having an unset used/free flag with an erase count less than COUNT$_{Max}$. It will be understood that each time a data file is programmed or moved according to the algorithm of FIG. 7 that the map in the CAM which correlates the logical address 308 to the physical address 408 is updated so that the computer system can always access the data files.

The efficiency of these algorithms has been tested by simulation. In the simulation it was assumed that the mass storage was 50% filled with data files that are not changed, 30% with data files that are routinely changed and 20% empty. Of the 30% of the data files that are routinely changed, ⅓ are rewritten 70% of the time, ⅓ are rewritten 25% of the time and ⅓ are rewritten 5% of the time. The simulation showed that the algorithm 1 improves the number of cycles until any block has reached failure by between six and seven times and algorithm 2 by approximately two times over the improvement gained using algorithm 1 alone. Depending upon the design criterion of a target system, it is possible to utilize either algorithm 1, algorithm 2 or the merged algorithm.

A bit is programmed into the counter for each erase cycle rather than using binary counting. Thus, an eight bit counter register would only be able to count to eight. This avoids having to erase the counter and then reprogramming it with an incremented value as would be necessary for binary counting. This is preferred because it avoids having to temporarily store the count value for all of the blocks being erased. By programming a bit for each, the counter registers need not be erased until all the blocks reach maximum count and there is a general erase.

Because the mass storage apparatus can accommodate large data storage, it is likely that many blocks will be flagged for a clean-out erase. Either a temporary volatile storage would be necessary for each block to store the previous count value prior to incrementing and reprogramming or the erase and updating of the counters would have to be done one after the other. One solution requires integrated circuit surface area and the other degrades performance. Note however, that if binary counting is desired the erase counter can be erased each time the block is erased and immediately reprogrammed. Because this will happen only during the periodic erase cycle described relative to the first algorithm some system designers may find this acceptable.

The read algorithm is shown in FIG. 8. A read instruction is received by the mass storage apparatus from the computer system (step 270). Concurrent with receiving the read instruction, the system also receives the logical address 308 of the data file needed by the computer system (step 271). The apparatus concatenates all the appropriate flags to the logical address 308 including having a set used/free flag, and unset new/old and defect flags (step 272). If a match is found in the CAM (step 273), the data file is read (step 275) otherwise a signal is returned to the computer system that the data file was not found (step 274).

Unfortunately, all the flags, and the table correlating the logical block address to the physical block address are maintained within an array of CAM cells. As is well known, CAM cells require multiple transistors, typically six. Accordingly, an integrated circuit built for a particular size memory using CAM storage for the tables and flags will need to be significantly larger than a circuit using other means for just storing the memory.

SUMMARY OF THE INVENTION

The present invention is for a non volatile memory storage device. The device is configured to avoid having to perform an erase-before-write each time a data file is changed. Further, to avoid the overhead associated with CAM cell approaches which require additional circuitry. The device includes circuitry for performing two primary algorithms and an associated hardware architecture for a semiconductor mass storage device. It will be understood that 'data file' in this patent document refers to any computer file including commercial software, a user program, word processing software document, spread sheet file and the like. The first algorithm provides means for avoiding an erase-before-write cycle when writing a modified data file back onto the mass storage device. Instead, no erase is performed and the modified data file is written onto an empty portion of the mass storage. In addition, the second algorithm prevents any portion of the mass storage from being erased a substantially larger number of times than any other portion. This prevents any one block of the mass storage from failing and becoming unusable earlier than any other block thereby extending the life of the entire mass storage.

The semiconductor mass storage architecture has blocks sized to conform with commercial hard disk sector sizes. The blocks are individually erasable. In one embodiment, the semiconductor mass storage can be substituted for a rotating hard disk with no impact to the user, so that such a substitution will be transparent. Means are provided for avoiding the erase-before-write cycle each time information stored in the mass storage is changed. (The erase cycle is understood to include, fully programming each bit in the block to be erased, and then erasing all the bits in the block.)

According to the first algorithm, erase cycles are avoided by programming an altered data file into an empty mass storage block rather than over itself after an erase cycle of that block as done on a conventional hard disk. This would ordinarily not be possible when using conventional mass storage because the central processor and commercial software available in conventional computer systems are not configured to track continually changing physical locations of data files. The logical block address is stored in conjunction with the data file.

Periodically, the mass storage will fill up because there have been no erase cycles. At such times, the mass storage needs to be cleaned up with a multi-sector erase as fully described below.

According to the second algorithm, means are provided for evenly using all blocks in the mass storage. A counter tracks the number of times each block is erased. A programmable maximum value for the counter is also provided. As the number of erase cycles for a block becomes one less than the maximum, the block is erased one last time and written with another file having a then smallest number of erase cycles. It is also prevented from being erased thereafter by setting its erase inhibit flag. After all blocks approach this maximum, all the erase counters and inhibit flags are cleared and the second algorithm is then repeated. In this way, no block can be erased a substantial number of times more than any other block.

Reading is performed in the present invention by providing the logical block address to the memory storage. The system sequentially compares the stored logical block addresses until it finds a match. That data file is then coupled to the digital system.

BRIEF DESCRIPTION OF THE DRAWINGS

FIG. 9 shows a block diagram of the memory storage of the present invention.

FIG. 10 shows a more detailed block diagram of one of the information blocks of FIG. 9.

DETAILED DESCRIPTION OF THE PREFERRED EMBODIMENT

Figure 1:
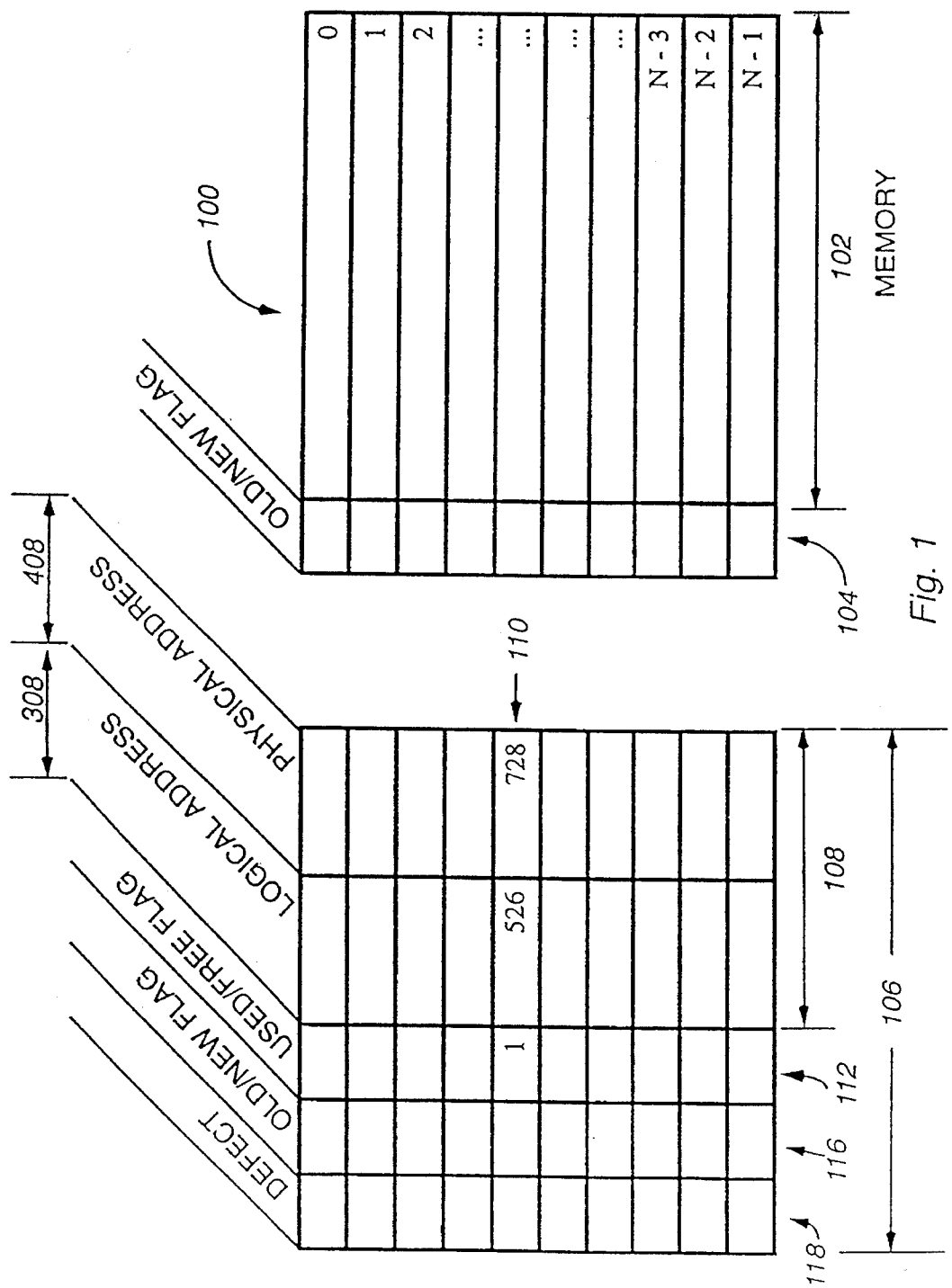
FIG. 1 shows an architecture for a semiconductor mass storage which is applicable to the present invention.

FIG. 9 shows an architecture for implementation of a solid state storage media according to the present invention. The storage media is for use with a digital system. According to the preferred embodiment, all of the memory storage is FLASH. The FLASH may be replaced by EEPROM. A memory storage 600 is arranged into X data blocks from zero 602 to X-1 606. Each data block 602 through 606 is Y bytes long. The data blocks are preferably 512 bytes long.

A table 610 of information blocks is provided which relates to the memory storage 600. There are X information blocks. An information block 612 through 616 is provided for and corresponds to each data block 602 to 606. Unlike the inventors' previous inventions, the information blocks are not CAM cells and accordingly, require significantly less transistors to achieve the functions set forth below. Each information block 612 through 616 includes information related to the address, status of flags and error checking information for each corresponding data block 602 through 606.

FIG. 10 shows a block diagram of the contents of a representative one 618 of the information blocks 612 through 616. It should be apparent to one of ordinary skill in the art that most of the fields of information associated with each data block 602 through 606 correspond to those fields in the systems disclosed in the inventors' corresponding U.S. patent applications Ser. No. 08/037,893 filed on Mar. 26, 1993 and U.S. patent application Ser. No. 08/038,668 filed on Mar. 26, 1993 and issued on Feb. 7, 1995 as U.S. Pat. No. 5,388,083.

Figure 6:
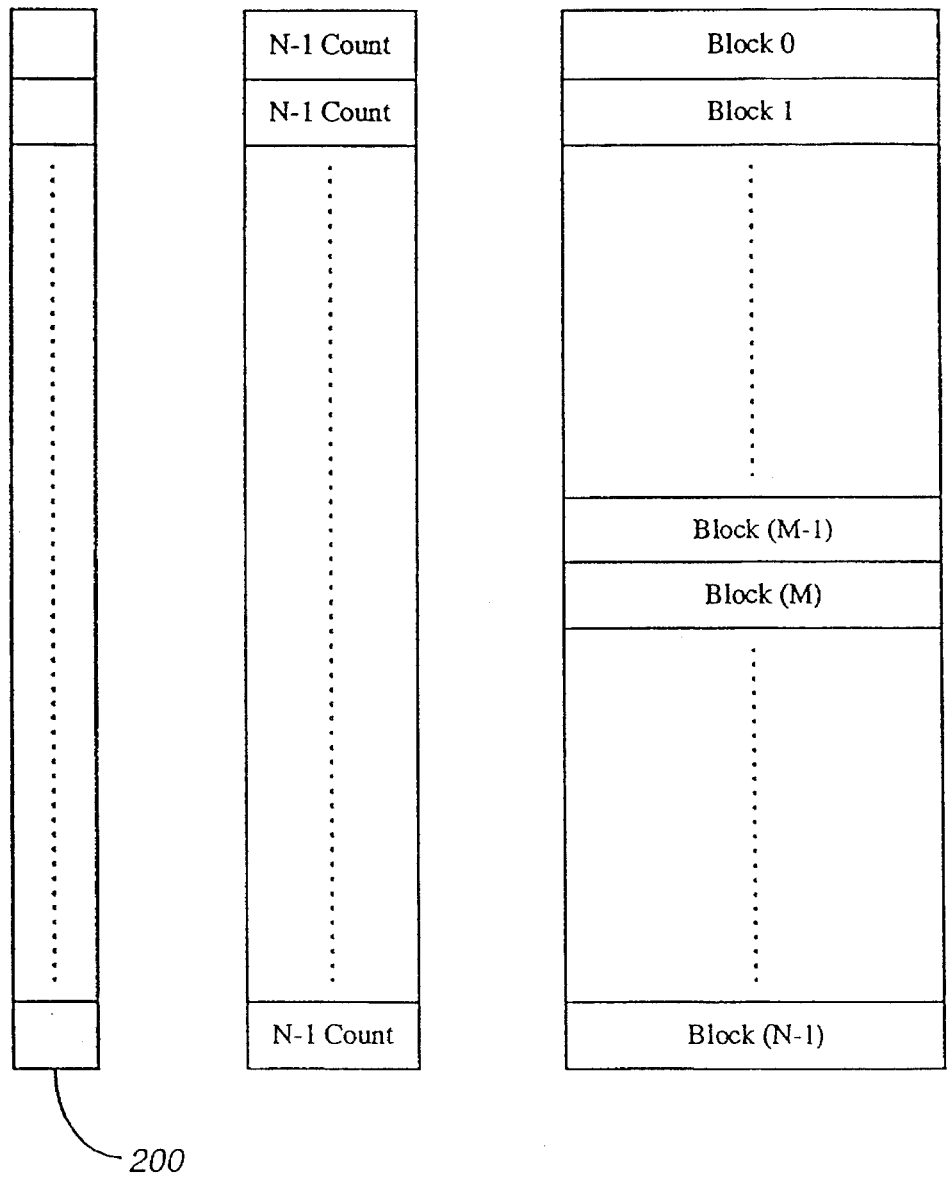
FIG. 6 shows an additional architecture according to the preferred embodiment of the previous solution.
Figure 7:
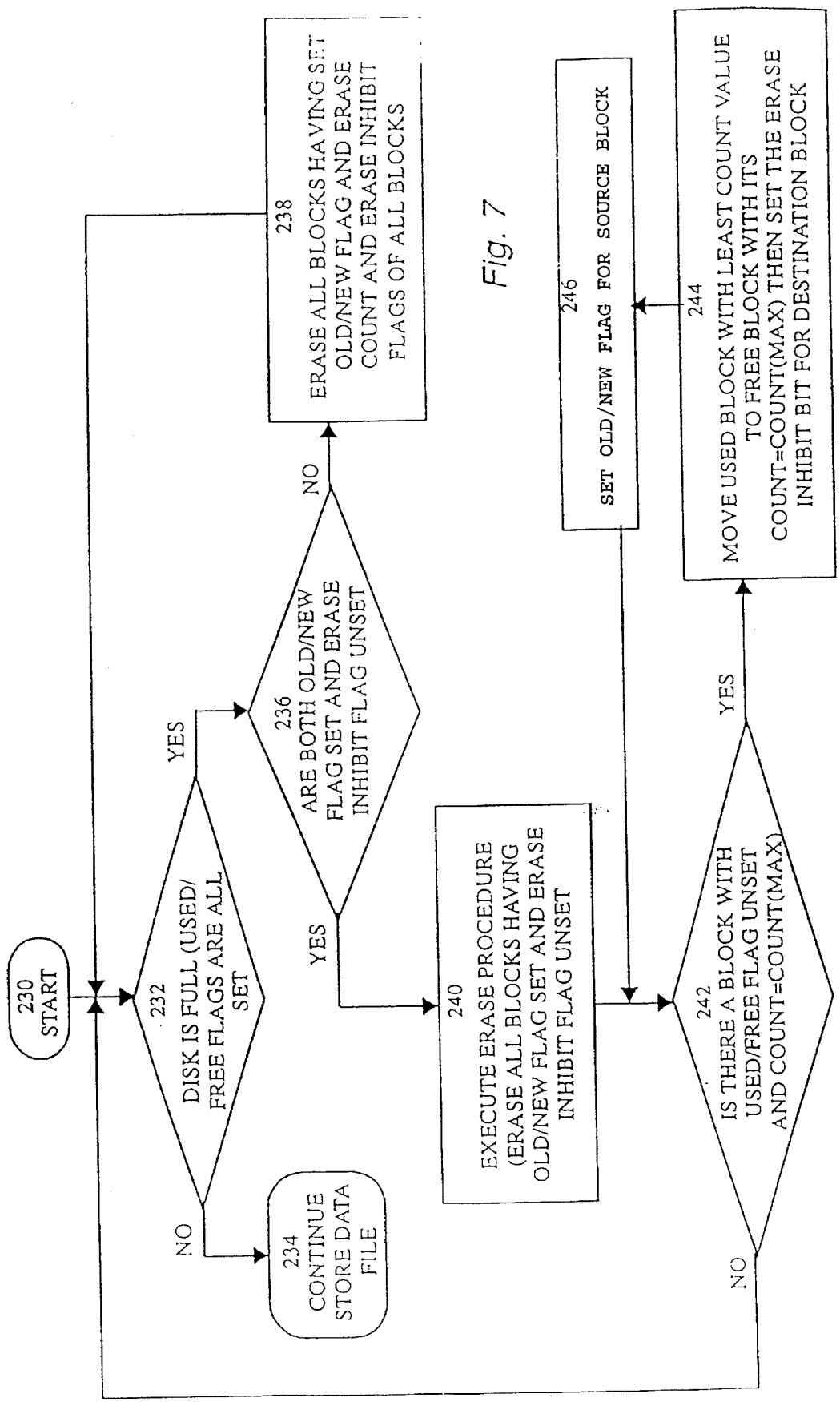
FIG. 7 shows a flow chart block diagram of algorithm 2 of the previous solution.
Figure 8:
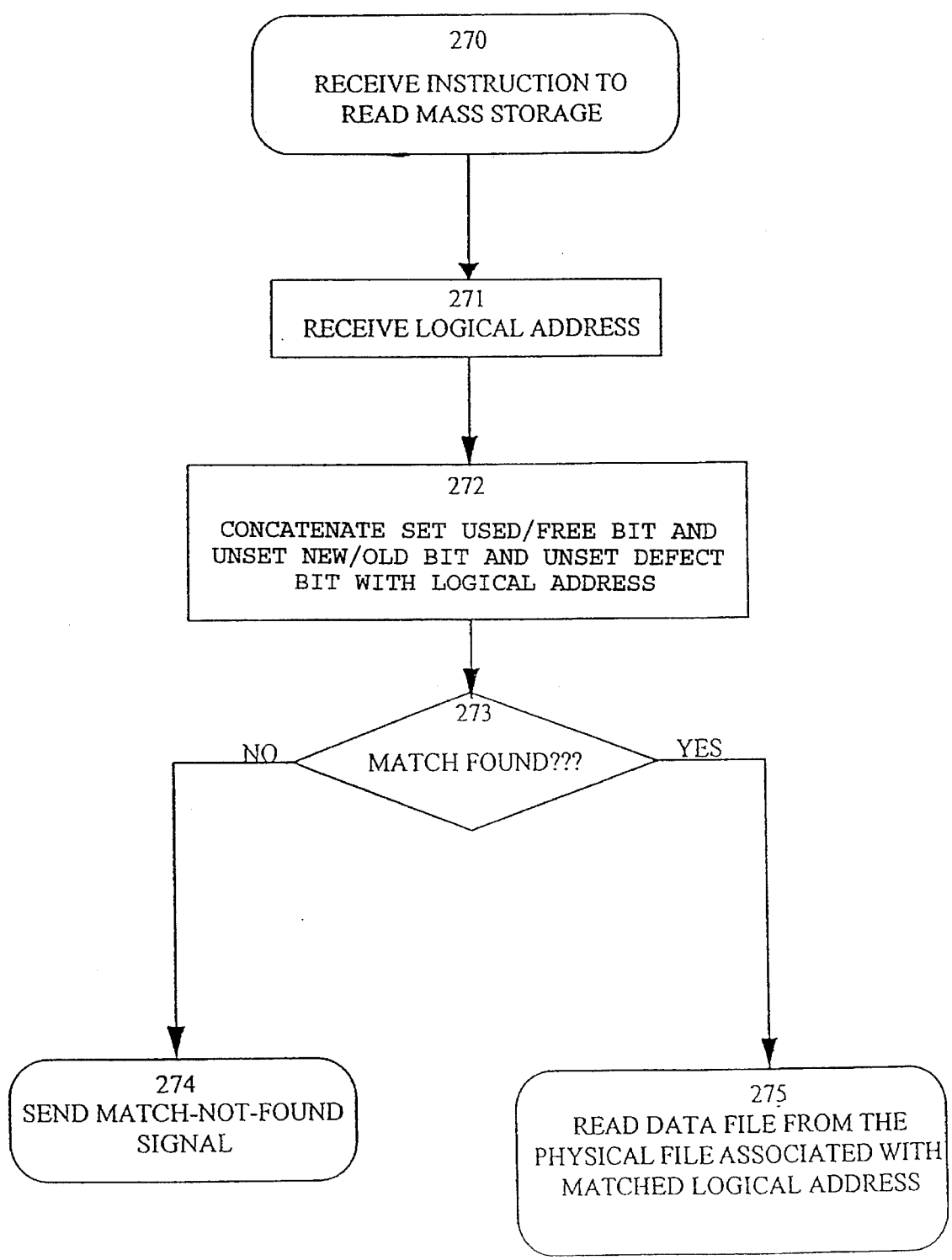
FIG. 8 shows a flow chart block diagram of a read algorithm according to the previous solution.

In particular, there is provided an eight bit wear out leveling counter 620 which corresponds to the erase inhibit counter of FIG. 6. A one bit erase inhibit flag 622 is provided which corresponds to the erase inhibit flag 200 of FIG. 6. A one bit defect flag 624 corresponds precisely to the defect flag 118 of FIG. 2. If a defect is detected in a data block 640 or information block 618, the corresponding defect flag 624 is set effectively removing that data block 640 and its corresponding information block 618 from any possible service as a memory storage location.

Similarly, a one bit used flag 626 and a one bit old flag 628 each correspond to the used/free flag 112 and the old/new flag 116, respectively. The operation of all these flags and the counter correlates exactly to the description of the corresponding flags in the background section of this application and the detailed description of the preferred embodiment in each of the corresponding parent applications.

Figure 2:
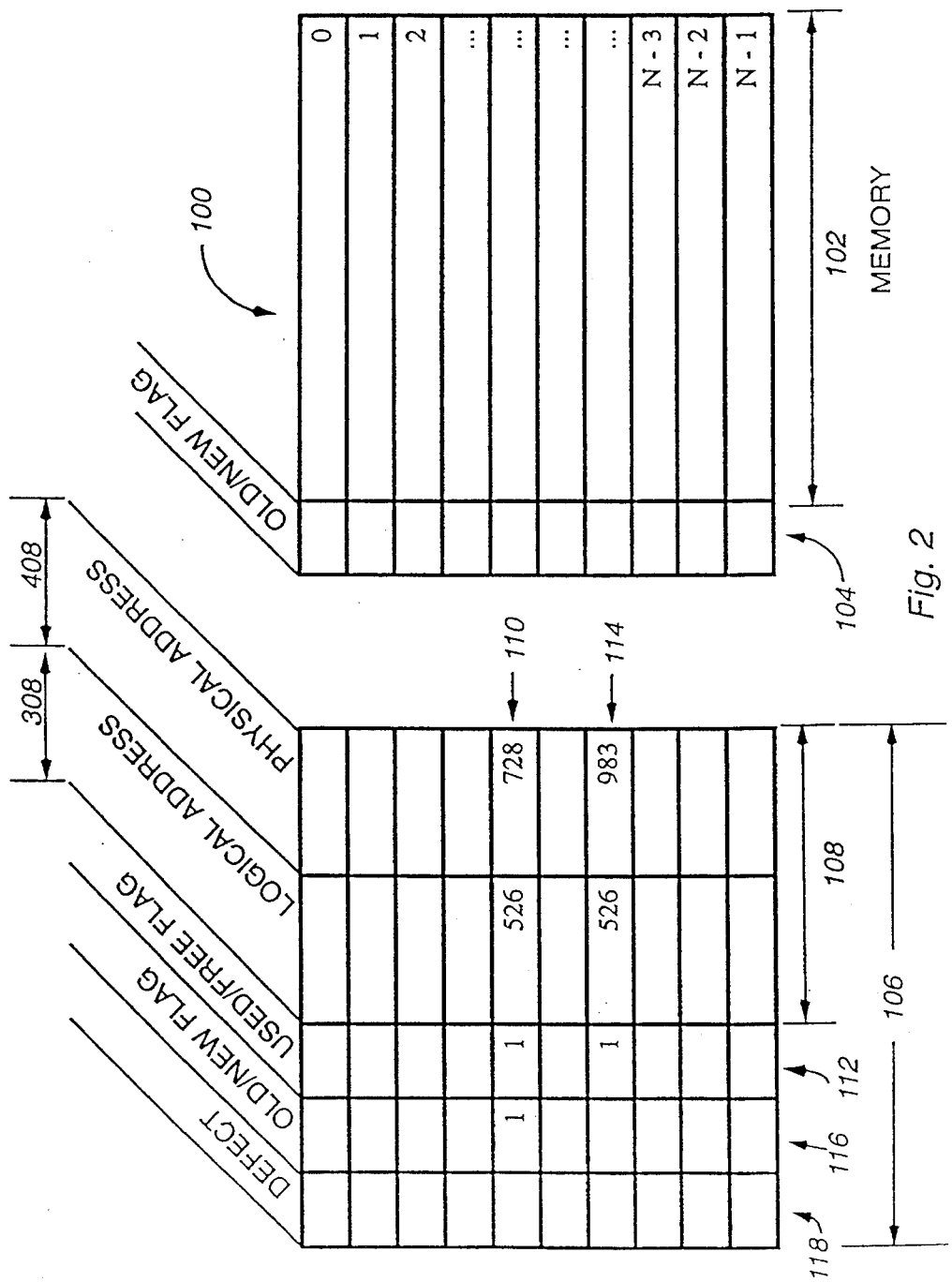
FIG. 2 shows the architecture of FIG. 1 which is applicable to the present invention wherein the data in one block has been altered and stored in a new physical address.
Figure 3:
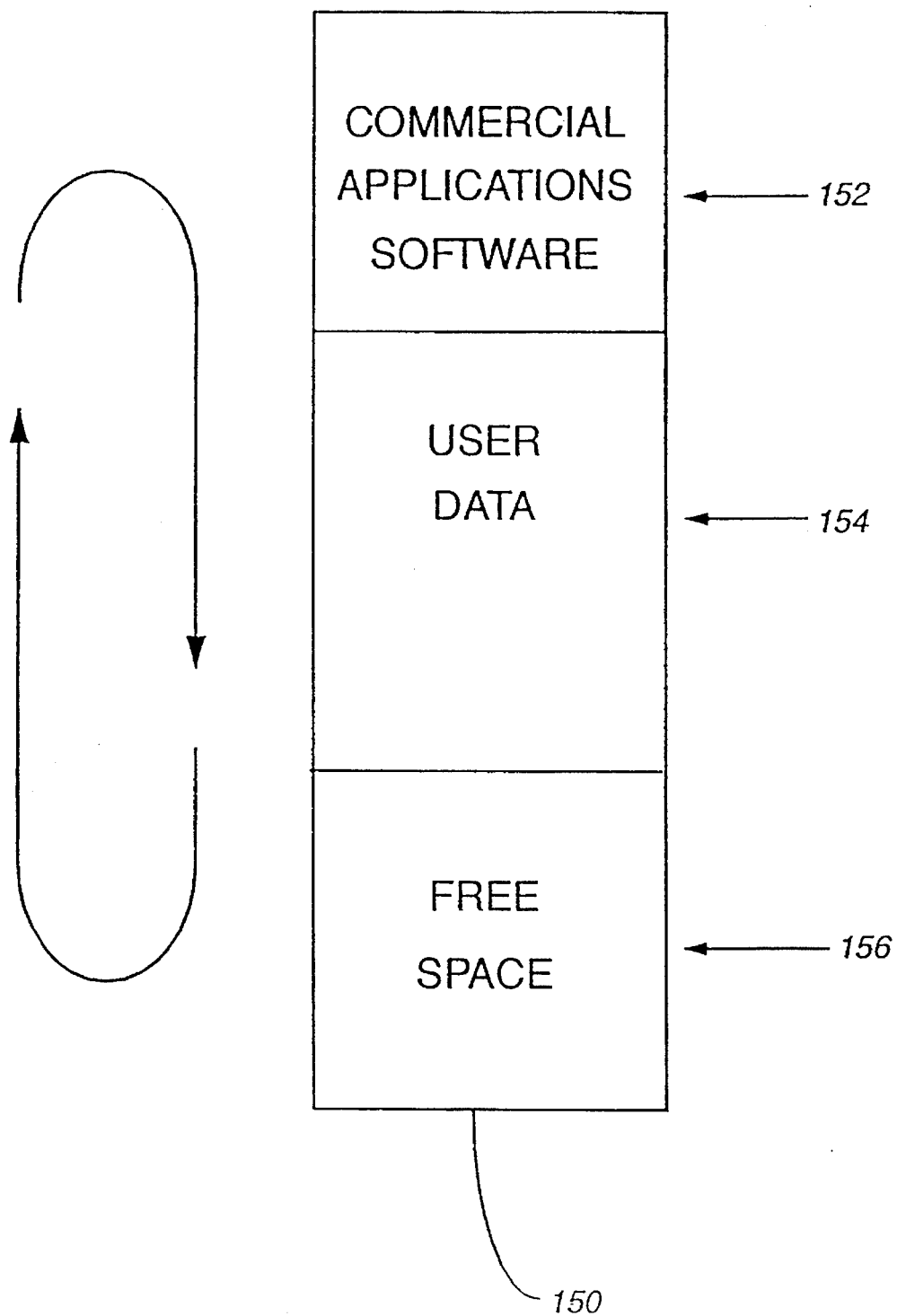
FIG. 3 shows a block diagram of an erase cycle usage according to algorithm 1 of the previous solution.
Figure 4:
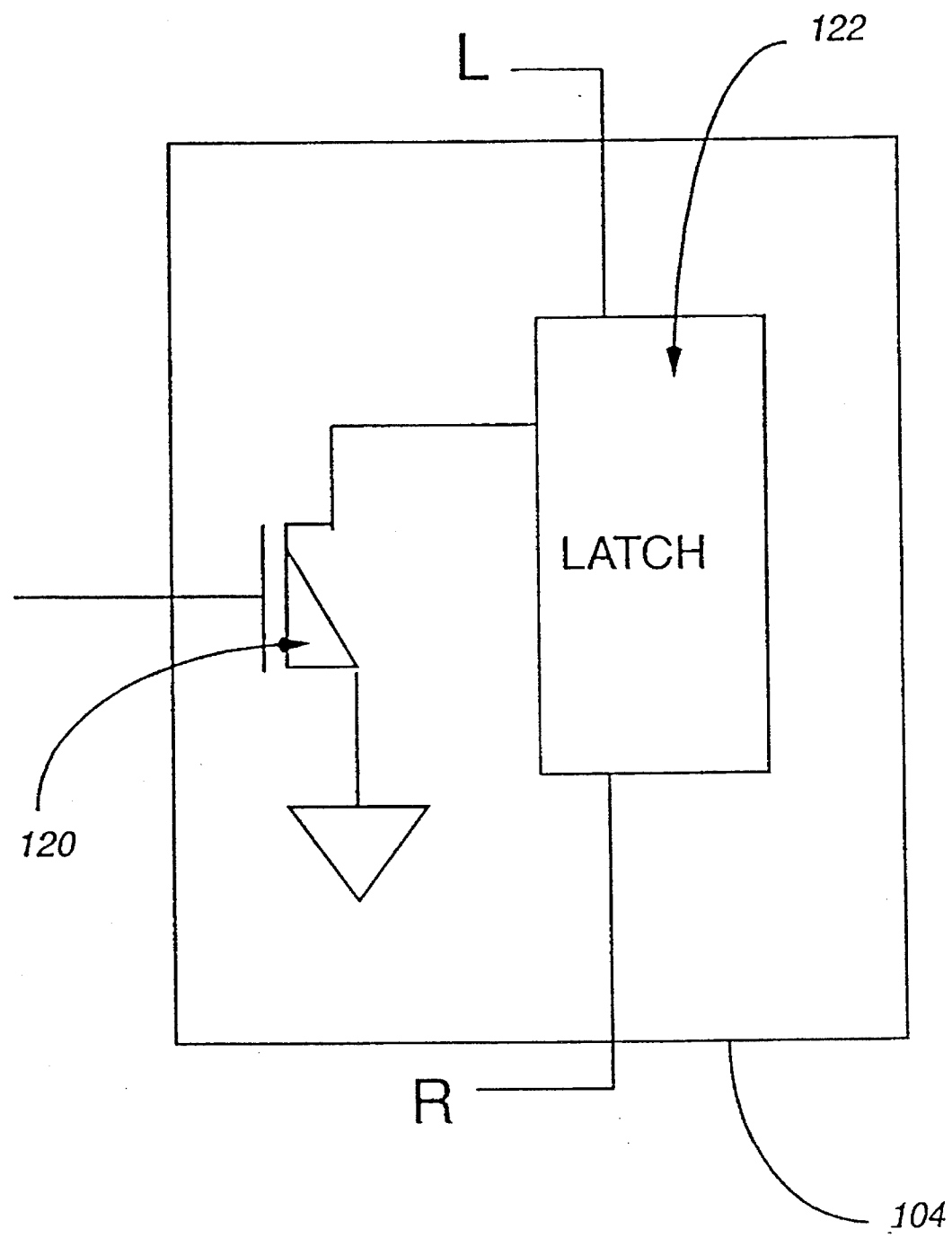
FIG. 4 shows a simplified block diagram of the old/new flag system integrally formed with the memory which is applicable to the present invention.
Figure 5:
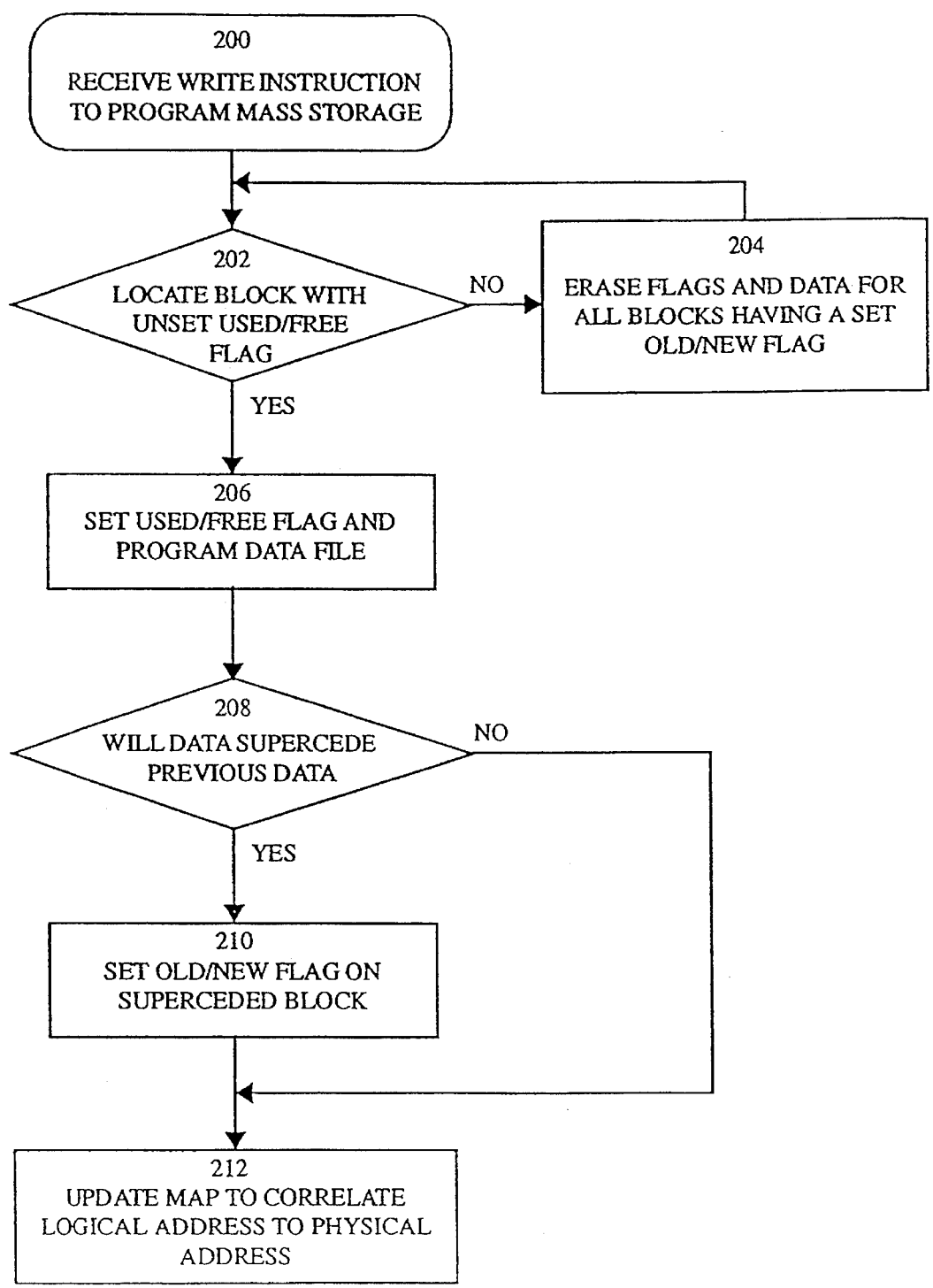
FIG. 5 shows a flow chart block diagram for algorithm 1 which is applicable to the present invention.

Each information block 618 also includes a logical block address 630 which corresponds to the logical address 308 of FIG. 2. However, rather than having a table correlating the physical address to the logical address, each individual information block stores only the logical block address 630 for its corresponding data block 602 through 606 which identifies the address where the digital system believes the data is stored. In the preferred embodiment, fourteen bits are used for the logical block address 630. It will be readily understood that larger or smaller memory stores require a corresponding larger or smaller number of bits.

In addition, each information block 618 can also include an error correction code 632. Preferably, thirty-two bits are provided for the error correction code 632 as a sufficient number of bits to correct most errors in a 512 byte data block 602 through 606. However, error correction codes of other numbers of bits can also be used for data blocks of 512 bytes depending upon the degree of correction necessary for the application. Note that the error correction code is not necessary for the operation of the present invention and will not be considered further in this description.

When storing new data for the first time into a data block 640, the system of the present invention first looks for an information block 618 having its erase inhibit flag 622, defect flag 624 and used flag 626 unset. Upon finding such a block, the system sets the used flag 626 to indicate that this information block 618 and its corresponding data block 640 have been used and no longer contain erased storage bytes. The system then writes the data into the data block 640 and next sets the old flag 628 for the replaced block if appropriate. Lastly, the logical address is stored into the logical block address 630 portion of the information block 618. This sequence is preferred because, if the information block 618 is stored first, and power is lost before the data block 640 is fully programmed, the system will believe that the data stored in the data block 640 is correct, when it is not.

As in the inventors' previous inventions, if a data block is changed and stored again, it is placed into a location in the memory storage which is empty. The old flag 628 for the replaced data block is then set indicating that the data stored therein is no longer valid. Periodically, the memory storage will fill so that there is no longer space into which to place new data. At such times, each block of data having its old flag 628 set and the erase inhibit flag 622 not set will be erased during a multi-sector erase cycle along with its corresponding used flag 626, old flag 628, logical block address 630 and error correction code 632. As part of the erase operation, the wear out leveling count 620 for each erase data block 640 and information block 618 will be incremented. Once the wear out leveling count 620 for a particular information block 618 reaches a predetermined maximum value, the erase inhibit flag 622 for that information block is set.

For purposes of this disclosure, a data block 640 and its corresponding information block are called a storage pair 642. At such times, information from a storage pair 642 having a lowest wear out leveling count 620 will be stored into another storage pair 642 having its wear out leveling count 620 at the predetermined maximum and its erase inhibit flag 622 set but otherwise being empty. This data shifting operation is repeated until all the storage pairs 642 having their erase inhibit flags set have received data or until all the blocks having a predetermined low threshold of wear out leveling count 620 have been shifted. Then another multi-sector erase cycle is performed. Each storage pair 642 from which data was shifted is now available for storing new data.

Periodically all, or essentially all the storage pairs 642 will have maximum wear out leveling count 620 values and set erase inhibit flags 622. At such times, a clean-out erase cycle is performed. During a clean-out erase cycle, the wearout leveling count 620 and the erase inhibit flag 622 are erased for all information blocks 618. Afterward, each storage pair having its old flag 628 set are completely erased. Typically, a clean-out erase cycle frees up a significant portion of the memory storage for storing new data. Also, this algorithm prevents any one portion of the memory storage from being erased a significant number of times more than any other portion.

Figure 11:
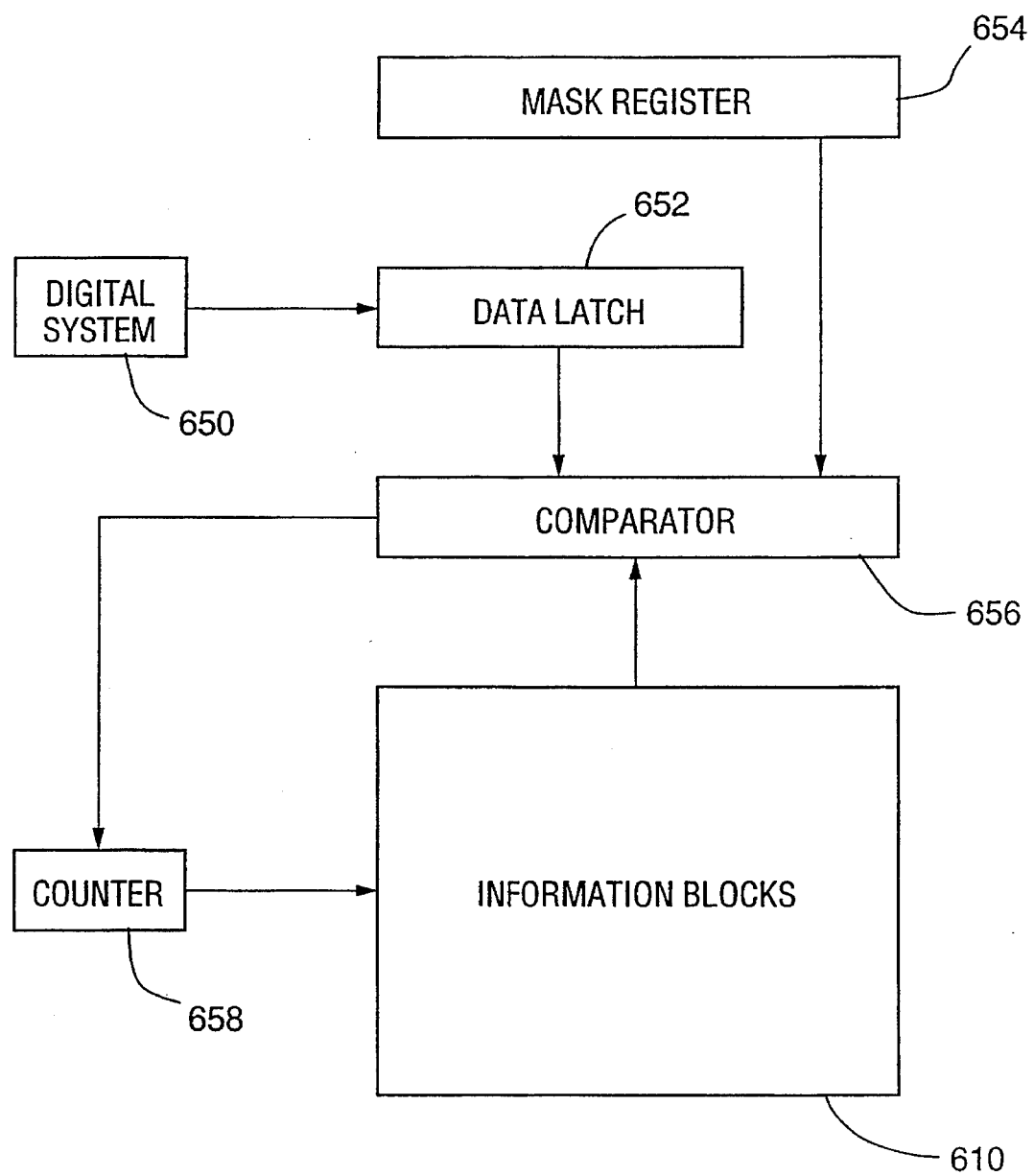
FIG. 11 shows a representational block diagram of a space management block which is applicable to the present invention.

To read a block of data, the digital system 650 (usually a processor, microprocessor or controller circuit) couples the logical address of the data it desires to a data latch 652 in the memory system of the present invention as shown in FIG. 11. The circuit of FIG. 11 is called a space management block. The bit location in the data latch 652 which corresponds to the bit location of the old flag 628 is preconditioned to an unset state. The mask register 654 is loaded with data to prevent comparisons of any bits except the old flag 624, or the defect flag 628 and the logical block address 630 (FIG. 10).

The information in the data latch 652 is compared to the old flag 628 and the defect flag 624 and the logical block address 630 from the first information block 612 (FIG. 9) in the comparator 656. If there is no match, that information is coupled from the comparator 656 to the counter 658. The counter 658 thereby causes the information from the next information block 614 (FIG. 9) to be compared to the information stored in the data latch 652 by the comparator 656. This process is repeated until a match is found, i.e., the logical address needed by the digital matches that are in the logical block address 630 and the old flag 628 is unset indicating that the data in the data block 640 is the current version. That data is then coupled to the digital system 650.

Figure 12:
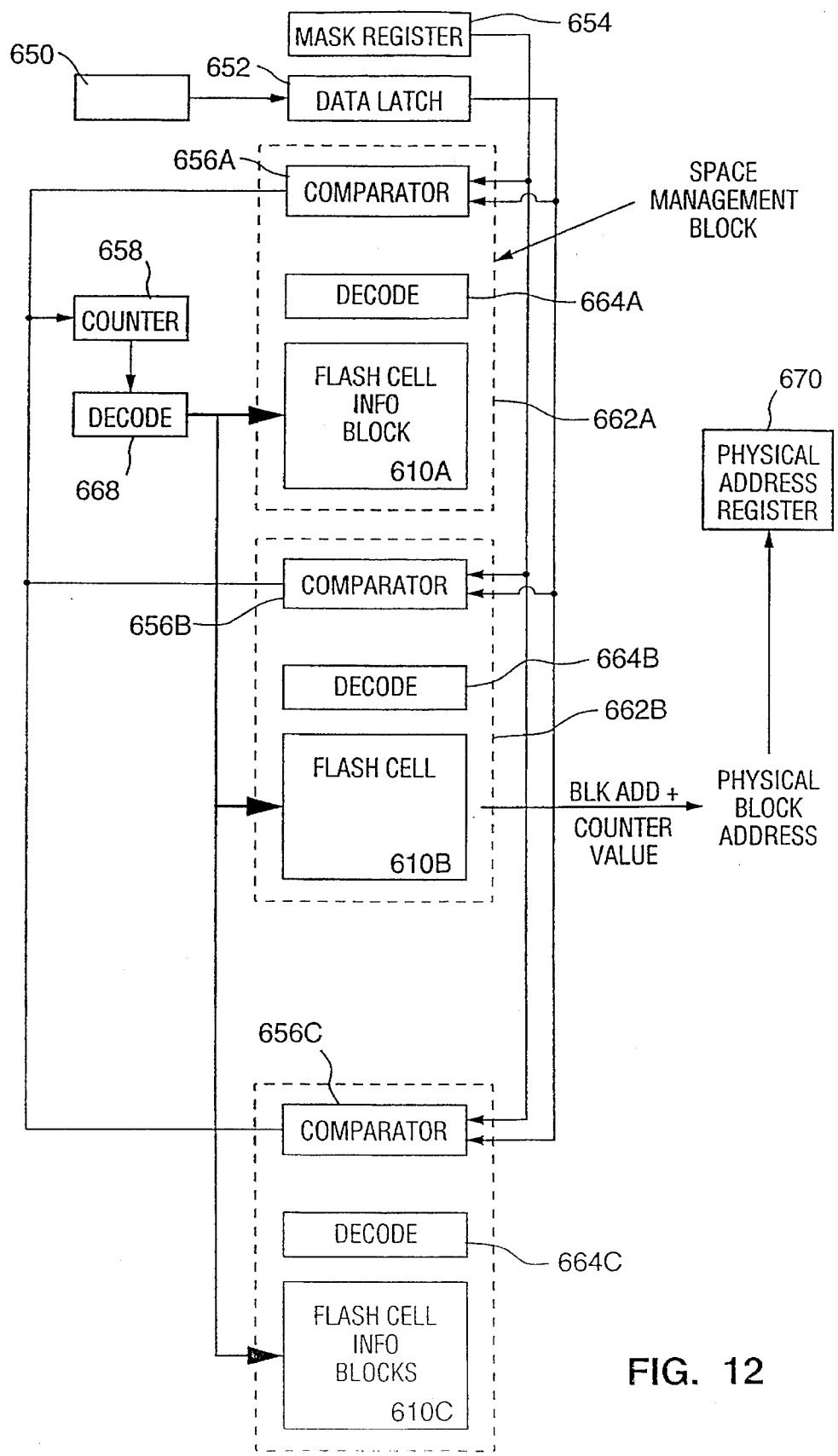
FIG. 12 shows a more detailed representational block diagram of the space management block of FIG. 11 along with a system incorporating a plurality of such blocks which is applicable to the present invention.

It will be apparent that as the memory storage 600 increases in size, the inherent latency to retrieve data from the system just described also must grow because the number of potential comparisons increases with X. Accordingly, the preferred embodiment includes provisions for partitioned space management blocks as shown in FIG. 12. The digital system 650 couples the logical address of the data it desires to the data latch 652. This single data latch 652 is coupled in parallel to all the space management blocks. The bit location in the data latch 652 which corresponds to the bit location of the old flag 628 is preconditioned to an unset state. The mask register 654 is loaded with data to prevent comparisons of any bits except the old flag 628 and the logical block address 630.

The information blocks 610 are divided into groups of blocks 610A, 610B, . . . , 610C. Each of the groups of information blocks 610A through 610C has a corresponding comparator 656A through 656C as shown. A decoder 664A through 664C is also included in each FLASH cell information block for decoding the address to correspond to a physical location.

If no match is found, the comparators each send an appropriate signal to the counter 658 which increments the count. The counter 658 is coupled to a decoder 668 for appropriately decoding the count value for selecting each appropriate information block 618 from each space management block 662A through 662C. Each space management block 662a through 662C has a block address. The physical block address for the location of the data having the appropriate logical block address is equal to the block address in which that information block is found plus the counter 658 value. The physical block address is coupled to a register 670 for reading the data block.

Figure 13:
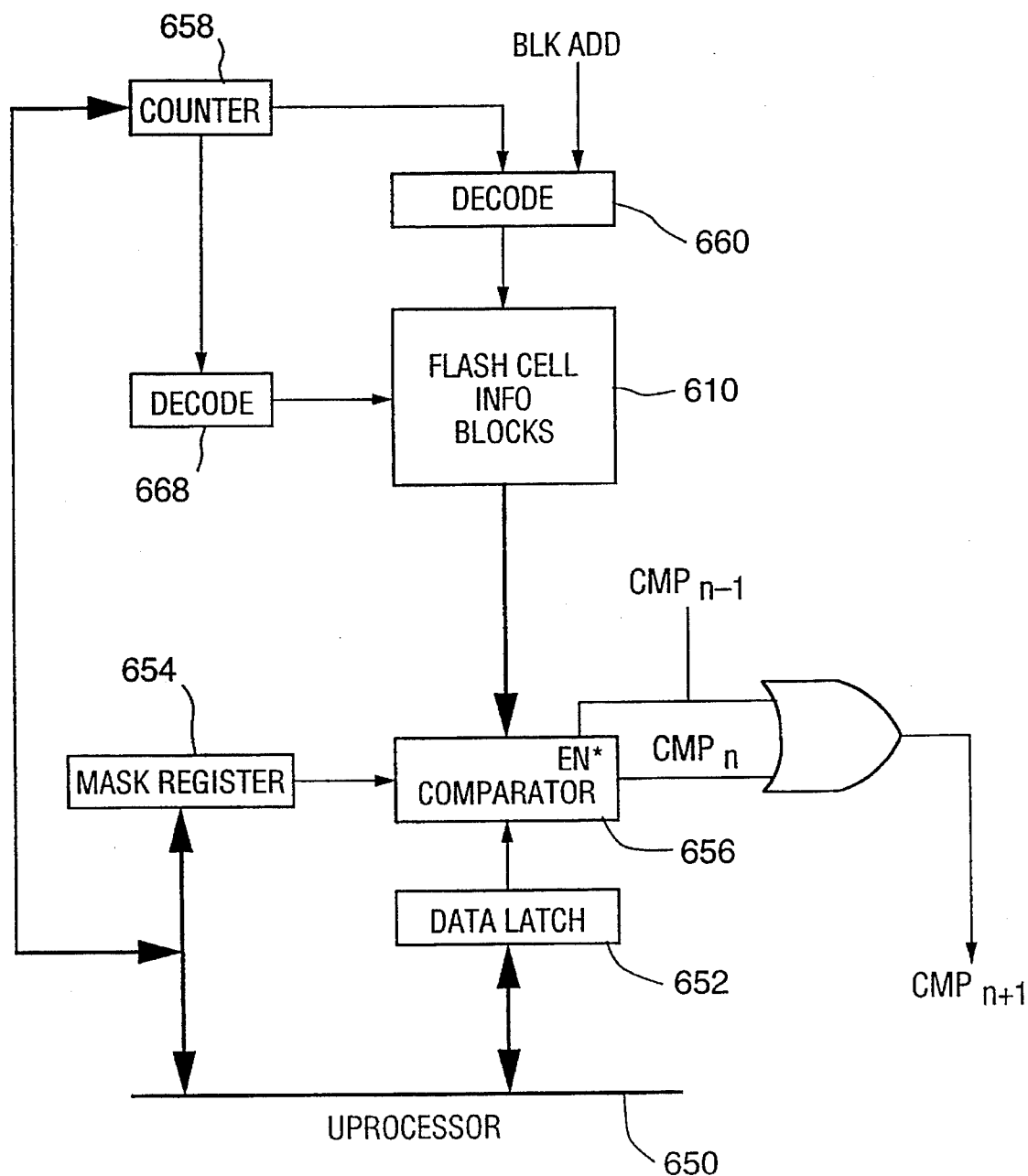
FIG. 13 shows a more detailed schematic block diagram of the space management block of FIG. 11 which is applicable to the present invention.

The configurations of the space management blocks shown in FIGS. 11 and 12 are representational only. FIG. 13 shows a more detailed block diagram of one of the space management blocks and its actual electrical interconnections. The digital system 650 is coupled via a data bus to the data latch 652, the mask register 654 and the counter 658. The counter is coupled to provide the current count to each of the internal decoders 660 and the decoder 668 that is in turn coupled to each of the space management blocks 662 (FIG. 12). Both decoders 660 and 668 are coupled to appropriately select the next information block 618 from the array of information blocks 610. The data from the information blocks is coupled to the sense amplifier (not shown) which forms the output signal that is coupled to the comparator 656. The data stored in the data latch 652 is also coupled to the comparator 656. The comparator is controlled by the mask register 654 to only compare those bits of interest. The output of the comparator is coupled to an OR gate for indicating a match and disabling the other blocks.

The preferred embodiment of the present invention is for a 4 megabyte FLASH. Preferably there are 32 space management blocks each having 256 rows of information blocks 618 (FIGS. 9 and 10). Each information block 618 is associated with a 512 byte data block 640.

A system built according to the present invention includes control logic for carrying out the algorithms of the invention. Preferably, the information block 618 as well as the control logic are integrated onto a single integrated circuit. Preferably, such a system will include a controller integrated circuit that includes the information blocks 618 which is coupled for controlling the storage blocks. The storage blocks are formed of commercially available FLASH cells which are configured into 512 byte erasable blocks. It is also possible to integrate the data storage as well, however, typically the area necessary for such a large volume of storage information would prohibit the data storage from being integrated into the same silicon as the remainder of the system.

FLASH cells are manufactured using a floating gate technology. Unfortunately, the cost of manufacturing the control logic using floating gate technology can be more expensive than other processing technologies. Additionally, the access time for a FLASH cell is typically slower than the access time for RAM-type memories.

Figure 14:
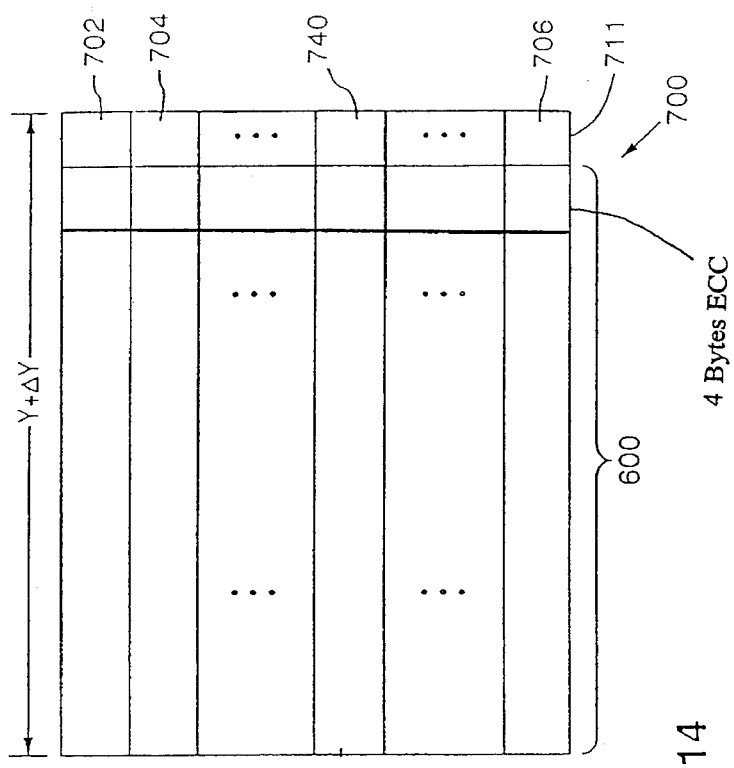
FIG. 14 shows a block diagram of the memory storage of an alternate embodiment of the present invention.

FIG. 14 shows an alternate architecture for implementation of a solid state storage media according to the present invention. The storage media is for use with a digital system. According to the preferred embodiment, all of the memory storage is FLASH EEPROM. The FLASH may be replaced by EEPROM. A memory storage 700 is arranged into X data blocks from zero 702 to X-1 706. Each data block 702 through 706 is Y+ΔY bytes long. The data blocks include 512 bytes for data storage and 8 bytes for storing the appropriate one of the information blocks flags, logical block address and error correction code.

Each data block 740 includes all the information stored in an information pair 642 (FIG. 9) of the preferred embodiment. Indeed, the logical block address is included within each data block address. Thus, it would be possible to search the data blocks 740 to find the appropriate data. Because of the likely size of the memory storage 700, it is preferable to simultaneously search for the desired logical block address in several groups of the memory storage.

Because the memory storage is configured to emulate a conventional hard disk, the entire memory storage will have a single address input and a single output. Thus, it is impractical to logically divide the data blocks 740 into space management blocks for simultaneous searching for the logical block address in the various groups. Accordingly, all the data in the information block is concurrently stored into a volatile storage of information blocks 710. This volatile storage is formed of RAM cells. The RAM cells are preferably SRAMs, but DRAMs may also be used.

Figure 15:
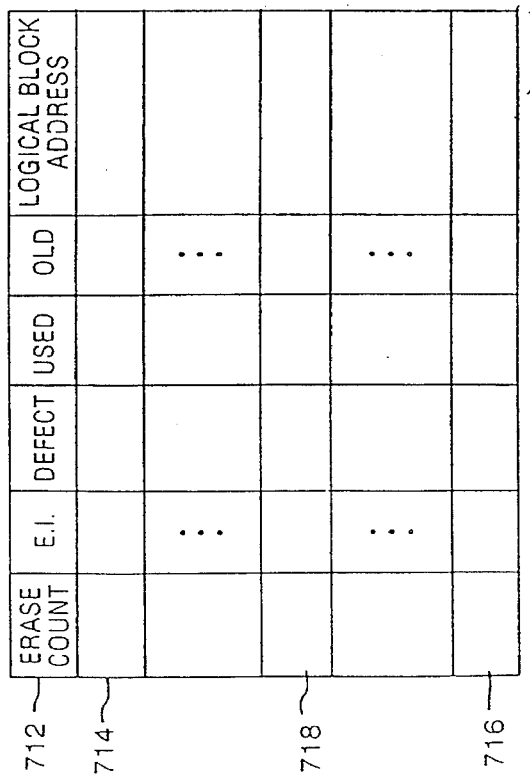
FIG. 15 shows a more detailed block diagram of one of the information blocks of FIG. 14.
Figure 15:
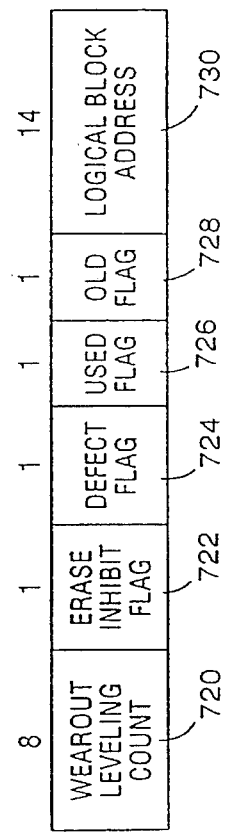

As in the preferred embodiment, the table 710 of information blocks relates to the memory storage 700. There are X information blocks. An information block 712 through 716 is provided for and corresponds to each data block 702 to 706. Each information block 712 through 716 includes information related to the address, status of flags and count information for each corresponding data block 702 through 706. The data in the information blocks 710 correspond precisely to the data in the information blocks 610 of the preferred embodiment as shown in FIG. 15.

During a write cycle, when storing new data for the first time into a data block 740, the system of the alternate embodiment first looks for an information block 718 having its erase inhibit flag 722, defect flag 724 and used flag 726 unset. Upon finding such a block, the used flag is set, then the data is stored into the data block 740, then the old flag is set for the previous data if appropriate and lastly, logical address is stored into the information block portion 711 of the data block 740. After this is performed, or simultaneously with the programming of the information block flags and data, the same information is first stored into the RAM information block 710 then in the FLASH.

The volatile information block 710 and nonvolatile information block 711 contain identical information so long as power is applied to the system. Naturally, upon power-down and certain power glitches all of the bits stored in the volatile information block 710 are lost. Upon a power-up, or system reset, the information stored in each nonvolatile information block 711 is copied to each volatile information block 710.

To read a block of data, the system operates like the preferred embodiment, except that the information blocks it reads are stored in volatile memory. To manufacture a system according to the alternate embodiment, a collection of space management blocks and the corresponding volatile memory are formed in a single integrated circuit. Thus, during a read cycle, each space management block searches the logical block address of a subset of the volatile information blocks 710 just like the nonvolatile information blocks 610 of the preferred embodiment.

Because the count data is stored in RAM, when programming the count information binary counting can be used without the unwanted extra erase cycle that would be necessary using the inventors' previous invention. Thus, with an eight bit counter the clean-out cycle could occur every 256 cycles rather than every eight using the single bit programming as before.

The present invention is described relative to a preferred embodiment. Modifications or improvements which become apparent to one of ordinary skill in the art after reading this disclosure are deemed within the spirit and scope of this invention.

What is claimed is:

1. A non-volatile semiconductor mass storage device comprising:
    a. a plurality of non-volatile data blocks, wherein each one of the plurality of non-volatile data blocks is selectively programmable and erasable and further wherein only those of the plurality of non-volatile data blocks that contain no data can be programmed;
    b. a plurality of non-volatile information blocks for storing status information, each of said plurality of non-volatile information blocks directly corresponding to an appropriate one of the plurality of non-volatile data blocks, each of said plurality of non-volatile information blocks including a first flag which is indicative that a corresponding appropriate one of the plurality of non-volatile data blocks has been programmed, and further wherein an address of each one of a plurality of logical blocks corresponds to a physical address of the appropriate one of the plurality of non-volatile data blocks;
    c. a comparator coupled to the plurality of non-volatile information blocks for determining whether any unprogrammed one of the plurality of non-volatile data blocks remain;
    d. a controller coupled to the comparator for setting a first flag;
    e. the controller for periodically erasing all of the plurality of non-volatile data blocks having first flags which are set;
    f. a storage programmer for storing a logical block address associated with each one of the plurality of non-volatile data blocks within an appropriate one of the plurality of non-volatile information blocks forming a stored logical block address, whereby an erase cycle is not needed each time an updated block replaces a superseded data block; and
    g. means for reading the non-volatile semiconductor mass storage device, comprising means for coupling a desired logical block address to the non-volatile semiconductor mass storage device and means for sequentially comparing the desired logical block address to each of the stored logical block addresses.

2. The non-volatile semiconductor mass storage device according to claim 1 wherein the first flag and the logical block address are stored in non-volatile memory.

3. The non-volatile semiconductor mass storage device according to claim 2 wherein the first flag and the logical block address are also stored in volatile memory.

4. The non-volatile semiconductor mass storage device according to claim 3 wherein the status information stored in the plurality of non-volatile information blocks is copied to the volatile memory during a power-up and a system reset.

5. The non-volatile semiconductor mass storage device according to claim 1 wherein the controller for periodically erasing simultaneously erases all blocks having first flags which are set.

6. The non-volatile semiconductor mass storage device according to claim 5 wherein the controller for periodically erasing comprises a plurality of non-volatile single bit storage cells, one non-volatile single bit storage cell for each of the plurality of non-volatile data blocks and coupled to each of the plurality of non-volatile data blocks, each one of the plurality non-volatile single bit storage cells for storing a second flag and a plurality of volatile latches, one for each of the plurality of non-volatile single bit storage cells, each volatile latch coupled to receive a logic state of the plurality of non-volatile single bit storage cells during an erase cycle.

7. The non-volatile semiconductor mass storage device according to claim 3 wherein the volatile memory comprises RAM cells.

8. The non-volatile semiconductor mass storage device according to claim 7 wherein the RAM cells are SRAM cells.

9. The non-volatile semiconductor mass storage device according to claim 8 further comprising means for ensuring which comprises a counter for each block for counting each erase cycle to which that block has been subjected.

10. The non-volatile semiconductor mass storage device according to claim 9 further comprising means for setting a predetermined maximum count value for each of the plurality of non-volatile information blocks and means for storing a count value in each information block for preventing one of the plurality of non-volatile data blocks from being programmed more than a maximum number of times relative to all other of the plurality of non-volatile data blocks, and an erase inhibit flag in each information block coupled to the means for setting a predetermined maximum count value, the erase inhibit flag having one of a set condition and an unset condition for each block for preventing further erases to a block having its erase inhibit flag in the set condition.

11. The non-volatile semiconductor mass storage device according to claim 10 wherein the count value in each information block is represented by a plurality of bits programmed according to binary counting.

12. The non-volatile semiconductor mass storage device according to claim 10 wherein the count value and the erase inhibit flags are stored in a content addressable memory.

13. The non-volatile semiconductor mass storage device according to claim 10 further comprising a reset means for erasing all counters and all erase inhibit flags for every block at the maximum count value once insufficient blocks remain to store a pending data file.

14. The non-volatile semiconductor mass storage device according to claim 13 further comprising means for reading the mass storage comprising:
   a. means for receiving the logical block address of a data file to be read;
   b. means for selecting an appropriate physical address, coupled to the means for receiving the logical block address of the data file to be read, wherein the appropriate physical address correlates to the logical block address of the data file to be read; and
   c. means for accessing the data file to be read from the appropriate physical address coupled to receive the physical address from the means for selecting an appropriate physical address.

15. The non-volatile semiconductor mass storage device according to claim 14 wherein the means for selecting an appropriate physical address comprises coupling the logical block address to a content addressable memory.

* * * * *